United States Patent
Singh et al.

(10) Patent No.: US 6,654,660 B1
(45) Date of Patent: Nov. 25, 2003

(54) CONTROLLING THERMAL EXPANSION OF MASK SUBSTRATES BY SCATTEROMETRY

(75) Inventors: Bhanwar Singh, Morgan Hill, CA (US); Christopher F. Lyons, Fremont, CA (US); Bharath Rangarajan, Santa Clara, CA (US); Khoi A. Phan, San Jose, CA (US); Ramkumar Subramanian, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/287,292

(22) Filed: Nov. 4, 2002

(51) Int. Cl.[7] .............................. G06F 19/00; G06K 9/80
(52) U.S. Cl. ........................... 700/121; 716/4; 382/144; 430/313
(58) Field of Search ......................... 438/14; 700/121; 716/4; 356/630, 301, 328; 430/30, 313; 382/144

(56) References Cited

U.S. PATENT DOCUMENTS 6,458,605 B1 * 10/2002 Stirton .......................... 716/4
6,509,201 B1 * 1/2003 Wright .......................... 716/4
6,529,282 B1 * 3/2003 Stirton ........................ 356/630

FOREIGN PATENT DOCUMENTS

JP            402242105       * 9/1990 ................. 382/218

* cited by examiner

*Primary Examiner*—Albert W. Paladini
(74) *Attorney, Agent, or Firm*—Amin & Turocy, LLP

(57) ABSTRACT

One aspect of the present invention relates to a system and method for controlling thermal expansion on an EUV mask during EUV photolithography. The system includes an EUV photolithography system for irradiating one or more layers of a wafer through one or more gratings of a patterned EUV mask, whereby heat accumulates on at least a portion of the patterned EUV mask during the irradiation of the one or more layers of the wafer; an EUV mask inspection system for monitoring the one or more gratings on the mask to detect expansion therein, the inspection system producing data relating to the mask; and a temperature control system operatively coupled to the inspection system for making adjustments to the EUV photolithography system in order to compensate for the detected expansion on the mask. The method involves employing feedback and feed forward control to optimize the current and future EUV photolithography processes.

26 Claims, 8 Drawing Sheets

CONTROLLING THERMAL EXPANSION OF MASK SUBSTRATES BY SCATTEROMETRY

TECHNICAL FIELD

The present invention generally relates to processing a semiconductor substrate. In particular, the present invention relates to controlling and/or mitigating thermal expansion as it may occur on a mask substrate during a photolithography process.

BACKGROUND ART

Achieving the objectives of miniaturization and higher packing densities continue to drive the semiconductor manufacturing industry toward improving semiconductor processing in every aspect of the fabrication process. Several factors and variables are involved in the fabrication process. For example, at least one and typically more than one photolithography process may be employed during the fabrication of a semiconductor device. Each factor and variable implemented during fabrication must be considered and improved in order to achieve the higher packing densities and smaller, more precisely formed semiconductor structures.

In general, lithography refers to processes for pattern transfer between various media. It is a technique used for integrated circuit fabrication in which a silicon slice, the wafer, is coated uniformly with a radiation-sensitive film, the photoresist, and an exposing source (such as optical light, X-rays, or an electron beam) illuminates selected areas of the surface through an intervening master template, the photoresist mask, for a particular pattern. The lithographic coating is generally a radiation-sensitized coating suitable for receiving a projected image of the subject pattern. Once the image is projected, it is indelibly formed in the coating. The projected image may be either a negative or a positive of the subject pattern. Exposure of the coating through the photoresist mask causes a chemical transformation in the exposed areas of the coating thereby making the image area either more or less soluble (depending on the coating) in a particular solvent developer. The more soluble areas are removed in the developing process to leave the pattern image in the coating as less soluble polymer. The resulting pattern image in the coating, or layer, may be at least one portion of a semiconductor device that contributes to the overall structure and function of the device.

With the advancement of semiconductor fabrication techniques toward smaller, more densely packed features comes increased demands for processing with shorter wavelengths of light and thinner photoresist materials. For example, in order to achieve smaller feature dimensions, wavelengths in the extreme ultraviolet (EUV) range of about 5 to about 25 nm are being employed in association with EUV masks. Such EUV masks can then be used to transfer images to underlying layers of material to form structures characterized by smaller dimensions.

Typically, chrome and nitride are used to form EUV masks. However, these are reflective materials and thus, are more difficult to produce precisely sized as well as smaller sized features therein. As a result, maintaining the precision and accuracy as well as achieving the smaller size dimensions are critical in the manufacture of EUV masks. Similar concerns are abundant with regard to other types of mask substrates.

The fidelity of the feature pattern emblazoned on the mask must be preserved at all times during formation of the mask and more importantly, when transferring the feature pattern from the mask to an underlying wafer to produce the device product.

Masks such as EUV masks afford the opportunity to create extremely small dimensioned features with precision on a wafer. However, due to the wavelengths and materials associated with mask photolithography, the light incident on the mask during the pattern transfer process yields heat in amounts not typically associated with other types of photolithography which use, for example, DUV light and the like. In particular, as a wavelength of light decreases, the energy of the wavelength of light increases. Thus, absorbing such smaller wavelengths of light tends to generate or build up increasing amounts of heat in a mask. This heat results in a translation expansion or thermal expansion of the mask. Consequently, the integrity of the EUV mask is compromised during wafer processing.

SUMMARY OF THE INVENTION

The following presents a simplified summary of the invention in order to provide a basic understanding of some aspects of the invention. This summary is not an extensive overview of the invention. It is not intended to identify key/critical elements of the invention or to delineate the scope of the invention. Its sole purpose is to present some concepts of the invention in a simplified form as a prelude to the more detailed description that is presented later.

The present invention provides a system and method for controlling thermal expansion as it may occur on a mask substrate during a mask photolithography process. More specifically, the system and method of the present invention involve mitigating excessive heat accumulation on the mask during a wafer exposure process in order to maintain the fidelity of the mask feature pattern when transferred from the mask to the wafer. This is accomplished in part by monitoring the mask during the wafer exposure process. In particular, a front surface and/or top surface of the mask may be measured using a scatterometer in order to detect thermal expansion on the mask, and especially at a particular grating of the mask.

Measurements maybe taken periodically, randomly, or at timed intervals in order to optimize the control of thermal expansion on the mask. In order to mitigate thermal expansion, the mask, as a whole or at least a portion thereof, may be treated in a cooling chamber and/or cooled in order to decrease the amount of heat accumulated on the mask. The cooled mask may be used again during a subsequent exposure of the wafer. Alternatively, or in addition, data generated corresponding to the thermal expansion detected on the mask can be fed forward to control thermal expansion in future photolithography processes. Furthermore, an amount of thermal expansion may be desired. Thus, the present invention facilitates obtaining a controlled amount of thermal expansion on mask substrates such as I-line, DUV, EUV, and G-line masks.

One aspect of the present invention relates to a system for controlling thermal expansion on a mask substrate during photolithography. The system includes a photolithography system comprising an irradiation source and a mask, whereby heat accumulates on at least a portion of the mask while irradiating one or more layers of an underlying wafer; a mask inspection system for monitoring one or more gratings on the mask to detect expansion therein, the mask inspection system producing data relating to the mask; and a temperature control system operatively coupled to the mask inspection system and the photolithography system for making adjustments to the photolithography system in order to compensate for the detected expansion on the mask.

Another aspect of the present invention relates to a system for controlling thermal expansion on a mask during photolithography. The system includes a photolithography system comprising an irradiation source and a mask substrate, whereby heat accumulates on at least a portion of the mask substrate while irradiating one or more layers of a wafer; a mask inspection system for monitoring and measuring the one or more gratings on the mask substrate to detect expansion therein, the mask inspection system producing data relating to the mask substrate; a processor operatively connected to the mask inspection system for processing and analyzing the data produced by the inspection system, thereby generating output related to the detected expansion on the mask; an mask temperature control system for receiving output generated by the processor in order to make an adjustment to one or more mask photolithography components to thereby compensate for the detected expansion in one or more of gratings on the mask; and a mask cooling system operatively connected to the EUV mask temperature control system for mitigating the accumulated heat on the mask.

Yet another aspect of the present invention relates to a method for controlling thermal expansion on a mask substrate during a photolithography process. The method involves providing a semiconductor structure having a patterned mask substrate thereover, the patterned mask substrate having one or more gratings therein; exposing the semiconductor structure through the one or more gratings of the patterned mask with a wavelength of light during a wafer exposure process; and monitoring the one or more gratings of the patterned mask for thermal expansion in order to generate data related to the one or more gratings.

DISCLOSURE OF INVENTION

Figure 1:
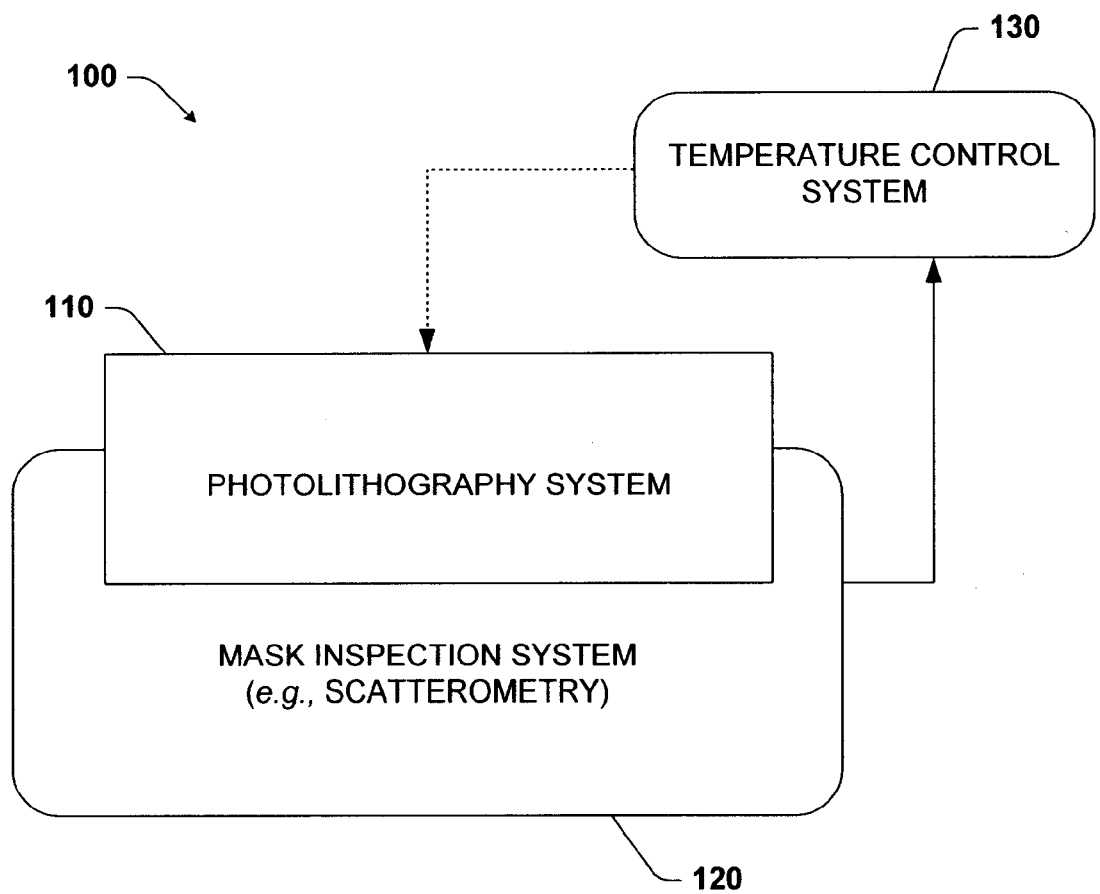
FIG. 1 illustrates a high-level, schematic block diagram of a system for controlling thermal expansion on an EUV mask in accordance with an aspect of the present invention.

The present invention involves a system and method for controlling thermal expansion on any mask substrate during a photolithography process. In particular, the present invention provides a system and method for mitigating thermal expansion at one or more gratings patterned in or on the mask. Because an amount of thermal expansion may be desired in some applications, the system and method also facilitate obtaining a desired and specified amount of thermal expansion in a controlled manner. Thermal expansion occurs as a result of heat accumulating on or near surfaces of the mask which causes the mask material to expand during the photolithography process.

For example, during an EUV photolithography process, portions of a semiconductor structure are exposed to a wavelength of light in the EUV range through one or more gratings of a patterned EUV mask. During this exposure process, the temperature of the EUV mask increases due to heat retained in the mask material. This accumulation of heat and/or increased temperature of the mask results in the undesirable expansion of the mask material. In particular, the EUV mask pattern may become distorted and malformed during the photolithography process such that as the process progresses, features etched into the semiconductor structure by way of the EUV mask would appear to be increasingly flawed and defective.

There may be many sources for the build up of heat on the mask such as, for example, light absorption, mask materials, material absorption, wavelength intensity, and the like.

According to an aspect of the present invention, thermal expansion on the mask may be controlled during the wafer exposure process. More specifically, the mask can be monitored during the exposure process using a scatterometer to examine the surfaces of the mask as well as detecting for pitch changes. For example, the scatterometer produces data corresponding to light directed to the mask as well as light reflected from the mask. The light data may be processed and analyzed in order to determine whether the mask, and its gratings in particular, demonstrate expansion or indications relating thereto. If thermal expansion is detected, then output relating to such can be communicated to a temperature control system.

According to one aspect of the present invention, the temperature control system ascertains adjustments to make to one or more photolithography components such that thermal expansion is mitigated in future wafer exposure processes. Examples of photolithography components include plasma type, pressure, flow rate, temperature, power, exposure time, and light wavelength. Alternatively or in addition, the temperature control system can signal a cooling chamber to treat the mask in order to mitigate the thermal expansion in time prior to a subsequent exposure of the semiconductor structure.

In another aspect of the present invention, a desired amount of thermal expansion may be obtained by monitoring and inspecting the mask during a photolithography process (e.g., transferring images from the mask to an underlying wafer) in a controlled manner. As a result, the mask may be cooled accordingly in order that a specified amount of thermal expansion occurs and is maintained on the mask.

Thus, the present invention controls thermal expansion on an EUV mask by mitigating and/or maintaining the expansion during an ongoing photolithography process and/or for future photolithography processes.

The present invention will be described in further detail as depicted in FIGS. 1–9 below. In particular, the present invention will now be described with respect to a (wafer) semiconductor structure being subjected to a photolithography process and an exposure process in order to transfer the images of a patterned EUV mask to the semiconductor structure. FIGS. 1–9 describe exemplary systems and methods for carrying out the present invention. Therefore, it should be understood that variations and modifications may be made and such are intended to fall within the scope of the present invention. In addition, the exemplary systems and methods demonstrated in FIGS. 1–9 may also be applied to various other types of masks including, but not limited to, I-line, G-line and DUV masks.

FIG. 1 illustrates a high-level, schematic block diagram of a system 100 for controlling thermal expansion during a photolithography process in accordance with the present invention. In particular, the system 100 includes a photolithography system 110 which utilizes a patterned mask and wavelengths of light in a suitable range (e.g., from about 5 angstroms and increasing therefrom). The system also includes a mask inspection system 120 positioned with respect to the photolithography system 110 in such a way as to monitor and measure the mask as it proceeds through the photolithography process.

The mask inspection system 120 is operative to communicate data and information corresponding to the mask and/or thermal expansion affecting the mask to a temperature control system 130. The temperature control system 130 determines what if any adjustments should be made to one or more components of the photolithography system 110 based on the data and/or information received from the inspection system. In addition, the temperature control system may also decrease the temperature of and around the mask in order to mitigate thermal expansion.

Figure 2:
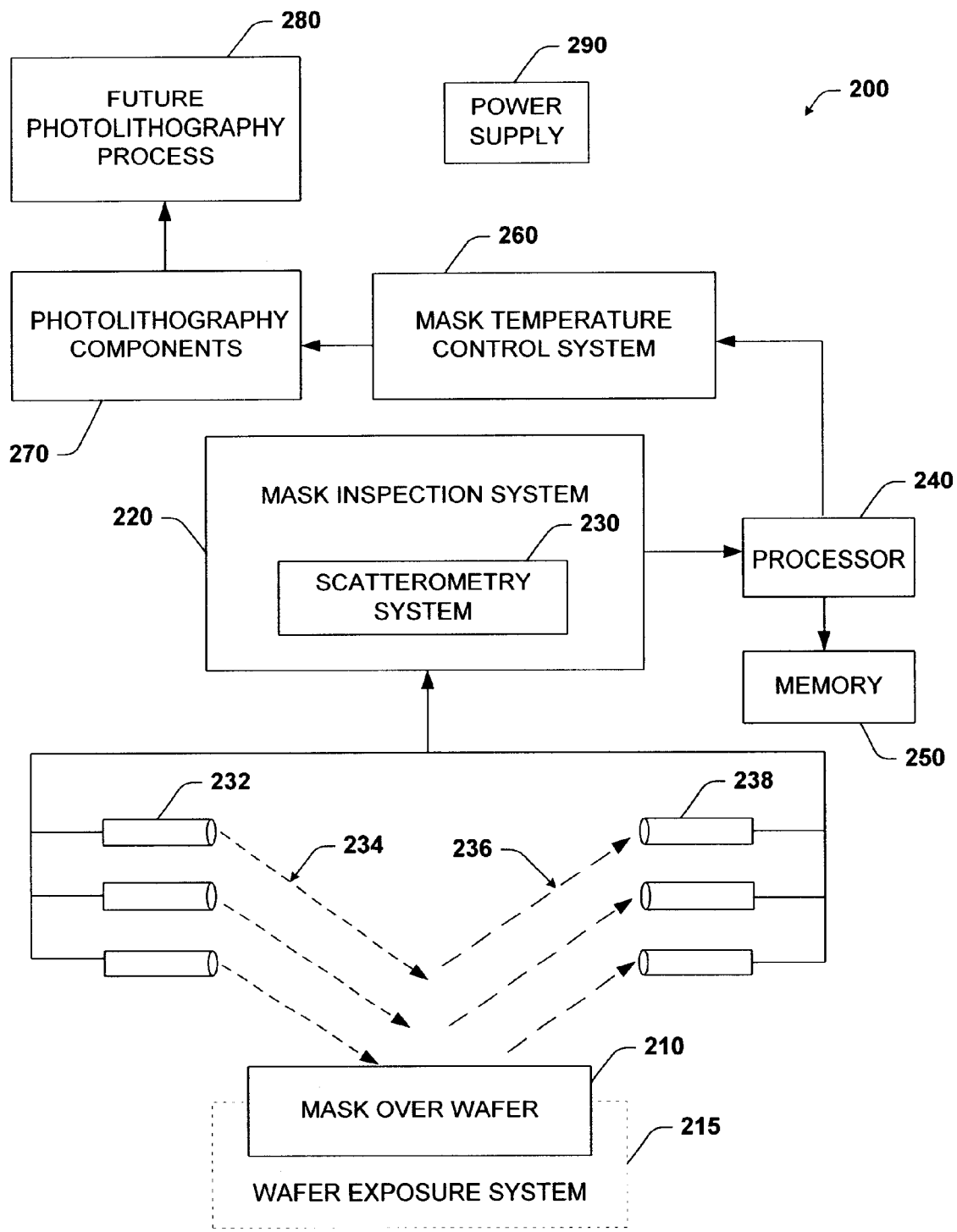
FIG. 2 illustrates a schematic block diagram of a system for measuring and mitigating thermal expansion on an EUV mask for a subsequent photolithography process using feedback control in accordance with an aspect of the present invention.

FIG. 2 is a schematic block diagram of an exemplary system 200 for mitigating thermal expansion on an EUV mask, for example, during a wafer exposure process in accordance with one aspect of the present invention. The system 200 includes a wafer or semiconductor structure 210 having a patterned EUV mask located thereover. The semiconductor structure 210 is positioned within a wafer exposure system 215 in order to undergo a wafer exposure process. It should be understood that the wafer exposure process comprises of at least one or a series of exposures all of which occur as part of a photolithography process.

As shown in FIG. 2, the patterned EUV mask over the semiconductor substrate 210 is being inspected for thermal expansion. In particular, the EUV mask, or at least a portion thereof, is being measured by an EUV mask inspection system 220 using a scatterometer 230. The scatterometer 230 can be used to measure the EUV mask. Such measurements may be utilized in order to determine changes between the EUV mask before or in the early stages of the exposure process and after or in the later stages of the exposure process. Thermal expansion may be more noticeable and detectable as the exposure process progresses since the EUV mask material may accumulate heat over time.

The scatterometer 230 can have variable grating sizes in order to facilitate obtaining the most accurate measurements of the EUV mask and in order to detect pitch changes or variations on the mask resulting from the thermal expansion. The scatterometer directs one or more beams 232 of incident light 234 at a front and/or top surface of the patterned EUV mask. The corresponding reflected light 236 is collected by one or more light sensors 238 and can then be analyzed by the inspection system 220 or by an external processor 240.

For example, the collected light data from the EUV mask can be processed and translated by the processor 240 into indices generated by graphing phase and intensity as a function of the wavelength of the incident light 234. In turn, expansion of the EUV mask material at any particular area of the mask can be determined from comparing such indices in real time as the photolithography process (e.g., wafer exposure) progresses. These comparisons allow for verification that the structures of the EUV mask material as well as the EUV mask itself have been altered.

This is accomplished in part by the processor 240 receiving the light data (both incident 234 and reflected 236) from the EUV mask inspection system 220. The processor 240 performs a number of analyses on the light data in order to readily determine whether any portion of the EUV mask is experiencing thermal expansion. Raw (e.g., not processed) and/or processed data and information may be stored for further investigation or future reference in a memory bank 250.

Information relating to the EUV mask can be communicated to the EUV mask temperature control system 260 which is operative to regulate the current as well as future photolithography processes via EUV photolithography components 270.

Examples of EUV photolithography components 270 include plasma type, pressure, flow rate, temperature, power, exposure time, and light wavelength. Depending on the light data (234, 236) collected by the EUV mask inspection system 220 and the data generated by the processor 240, the control system 260 may adjust one or more of the photolithography components 270 in order to mitigate and/or control an amount of thermal expansion in future wafer exposure and/or photolithography processes 280.

In order for the system 200 to operate effectively, a suitable power supply 290 such as a battery may be employed.

Figure 3:
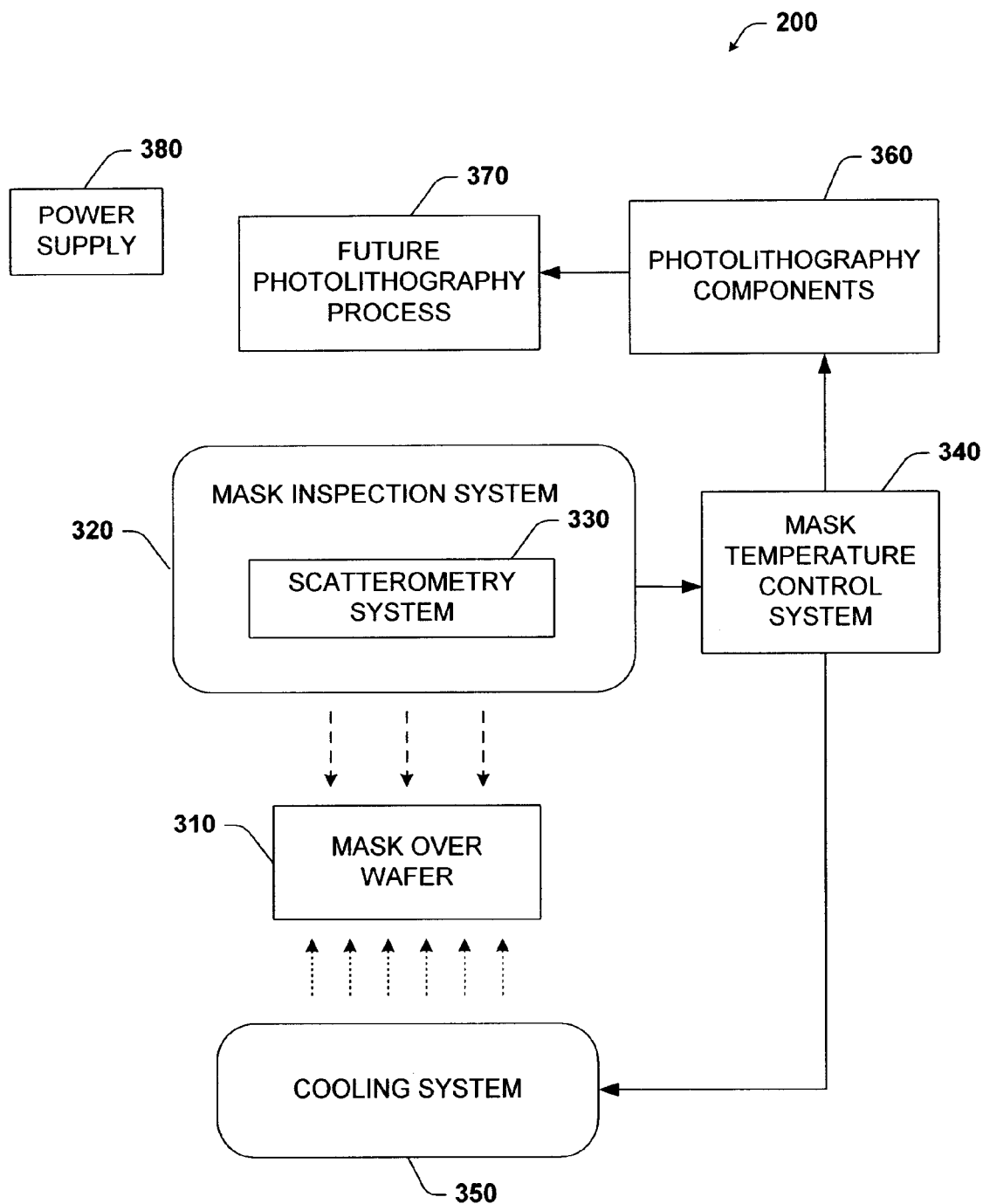
FIG. 3 illustrates a schematic block diagram of a system for controlling and mitigating thermal expansion on an EUV mask during a current photolithography process as well as subsequent processes in accordance with an aspect of the present invention.

Referring now to FIG. 3, a schematic block diagram of a system 300 for mitigating thermal expansion during an on-going EUV photolithography process in accordance with an aspect of the present invention is shown. The system 300 is similar to the system 200 described above in FIG. 2 in that it includes a mask-clad wafer 310 that is being subjected to a wafer exposure (step) within the photolithography process. As the photolithography process proceeds, the mask portion of the wafer 310 is monitored and measured by a mask inspection system 320, and in particular, a scatterometer 330, both of which are similar to their counterparts described in FIG. 2.

Measurements are taken of the mask, or at least a portion thereof, by capturing the incident and reflected light data associated with the mask. The measurements are processed and analyzed to generate further data. The generated data may be used to acknowledge in real-time whether the mask is demonstrating thermal expansion, or indications thereof.

A mask temperature control system 340 similar to the control system 260 of FIG. 2 receives data generated by a processor (not shown; FIG. 2) or by the mask inspection system 320. Using this information, the mask temperature control system 340 can either make adjustments to photolithography components 360 in order to mitigate thermal expansion in future EUV photolithography processes 370 or signal a cooling system 350 to treat the mask, or at least portions exhibiting an unwanted amount of thermal expansion, with cooling sufficient to alleviate and/or compensate for the unwanted thermal expansion on the mask. The cooling treatment applied to the EUV mask is illustrated by the dotted arrows in FIG. 3.

Alternatively, the temperature control system 340 can do both either simultaneously or in a successive manner such that the order of action is selected to optimize the system's (300) efficiency. To further confirm that the system 300 is operating at its most efficient and accurate pace, a suitable power supply 380 is employed.

Figure 4:
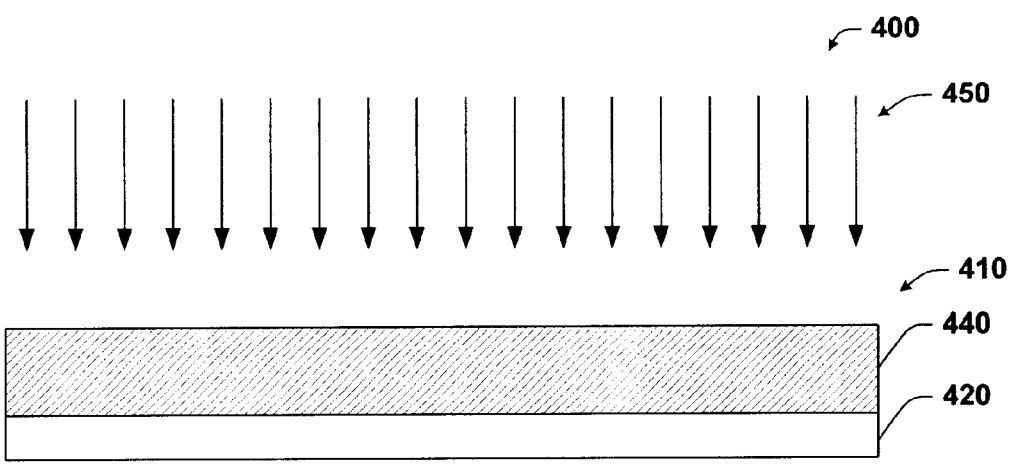
FIG. 4 illustrates a schematic, partially fabricated semiconductor structure in accordance with an aspect of the present invention.

Turning now to FIGS. 4–8, schematic diagrams of a semiconductor structure proceeding through a photolithography process, and in particular, a wafer exposure process are shown. In FIG. 4, a process 400 for forming an EUV mask, for example, can be initiated. Such EUV mask may be used in a subsequent photolithography process to irradiate and/or etch a semiconductor structure. A mask structure 410 is shown comprising a transparent substrate 420 and a reflective material layer 440. A photoresist layer may also be employed to facilitate fabrication of the EUV mask.

As shown in the figure, the reflective material layer 440 is being patterned 450 in order to form images of features, which are arranged to have a specified pitch, therein. The resulting EUV mask may be used as shown in FIGS. 5, 6 and/or 7.

Figure 5:
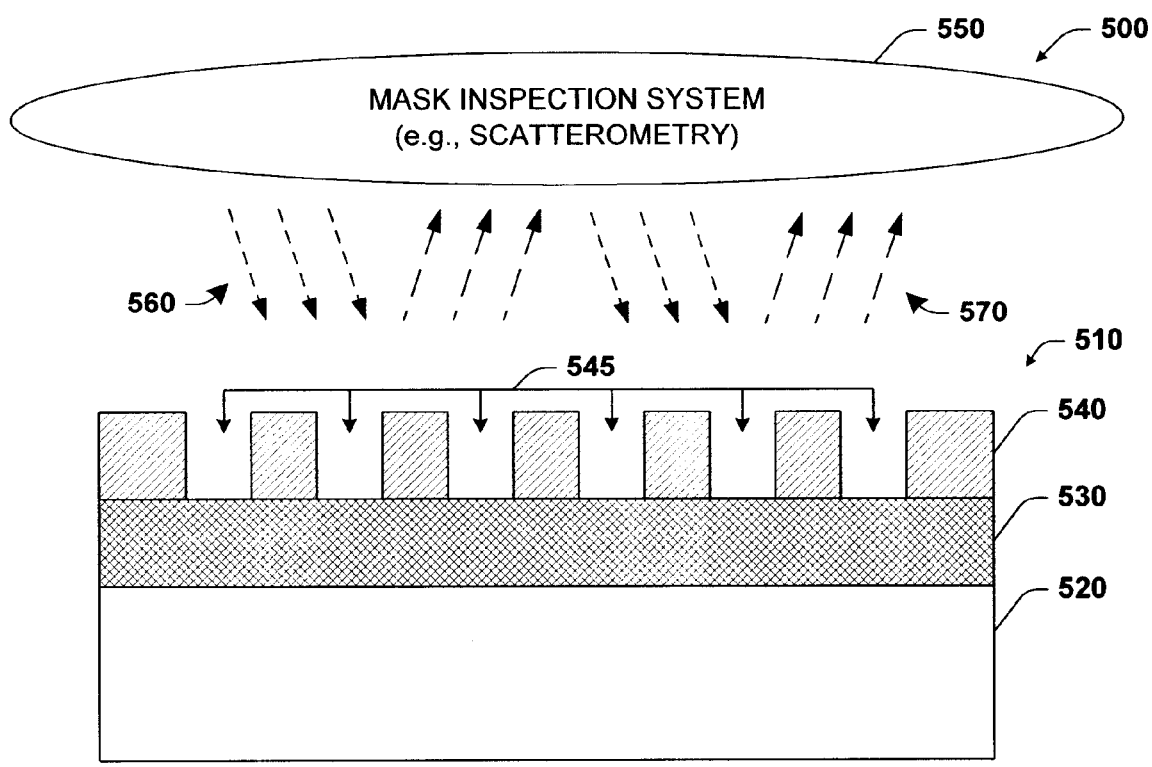
FIG. 5 illustrates a schematic, partially fabricated semiconductor structure about to undergo an EUV photolithography process such that an EUV mask is being monitored before the process in accordance with an aspect of the present invention.
Figure 6:
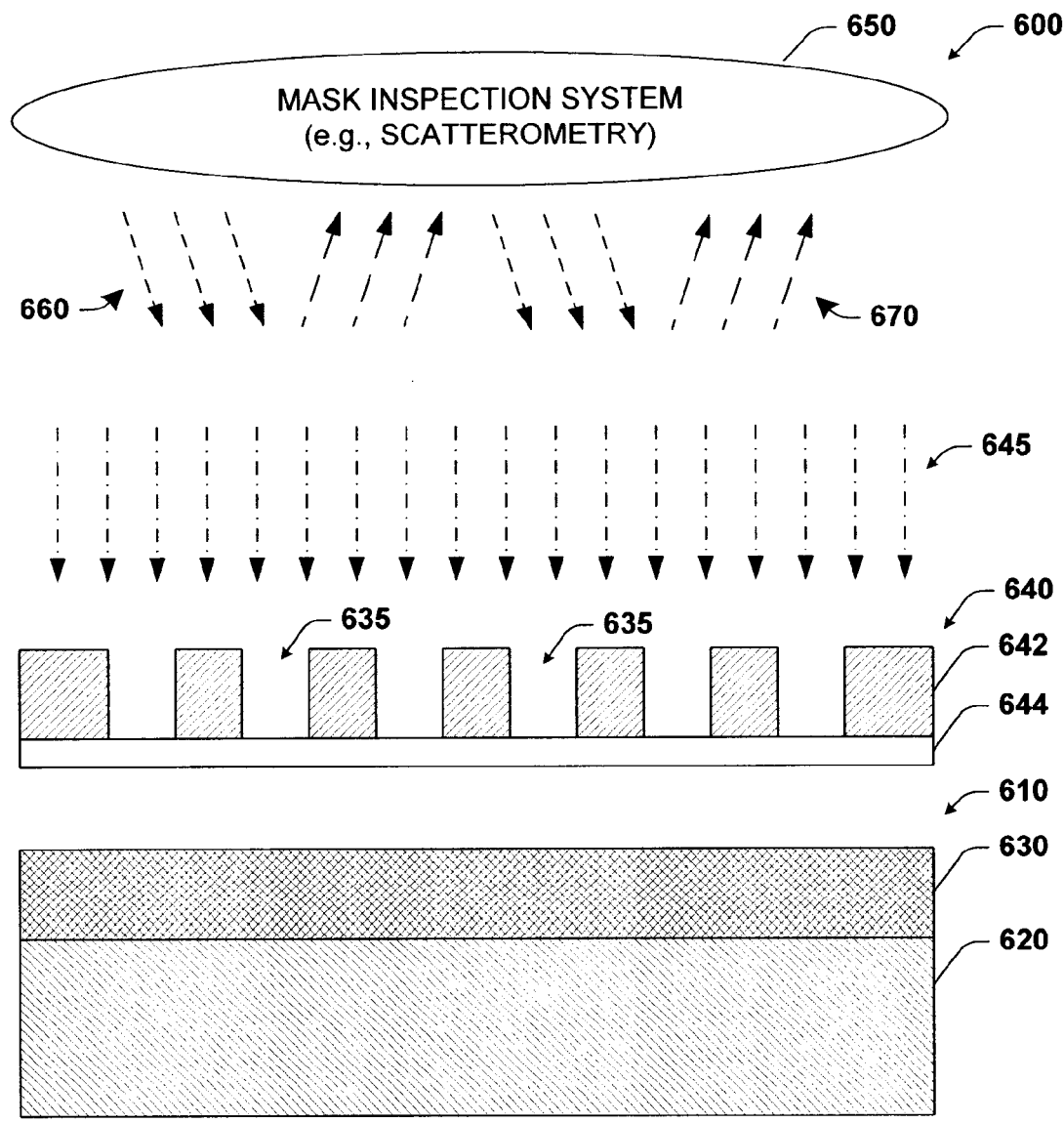
FIG. 6 illustrates a schematic, partially fabricated semiconductor structure having a patterned EUV mask thereon which is undergoing an EUV photolithography process in accordance with an aspect of the present invention.

FIG. 5 illustrates a process 500 for controlling thermal expansion during a photolithography process, and more specifically, during a wafer exposure process. As shown, a semiconductor structure 510 comprising a silicon substrate 520, a layer of material 530 formed over the substrate 520, and a patterned EUV mask 540 lying over the layer of material 530. It should be appreciated that although only a single layer of material 530 is depicted in FIG. 5, one or more layers of material may be formed between the EUV mask 540 and the substrate 520. The layer or layers of material 530 may comprise any metal, non-metal, organic, and/or inorganic material, or a combination thereof depending on the desired application for the device.

The EUV mask 540 has been patterned with one or more features 545 such as for example, vias, contact holes, trenches, and the like. When the pattern includes multiple features 545, the features 545 may be arranged to have one or more pitches. The patterned EUV mask 540 may be formed over the layer of material 530 as illustrated in FIG. 5. Alternatively, however, the process 500 may be carried out whereby the EUV mask 540 is positioned over the layer of material 530 but does not contact the layer 530 directly. The latter arrangement is demonstrated in FIGS. 6 and 7 below.

Still referring to FIG. 5, the semiconductor structure 510 is monitored by an EUV mask inspection system 550 as the wafer exposure process begins. In order to control and/or mitigate thermal expansion from affecting the EUV mask during the wafer exposure process, the EUV mask inspection system 550 can be programmed to continually or intermittently take measurements of the EUV mask. Measurements may be collected by a scatterometer (FIG. 2 and 3). For example, the scatterometer directs one or more beams of light 560 according to scatterometric techniques on or over at least a portion of the EUV mask 540 (e.g., at least a portion of the feature 545). Reflected light 570 can then be collected for analysis. It should be appreciated that either the structure 510 or the inspection system 550 may be mobile in order to perform the inspection of the EUV mask 540.

FIG. 6 demonstrates a process 600 for controlling thermal expansion on an EUV mask during a wafer exposure process using EUV photolithography methods. A semiconductor structure 610 comprising a silicon-based substrate material 620 and one ore more layers 630 of material formed over the substrate 620. An EUV mask 640 having one or more gratings 641 (openings) is positioned over the structure 610. The EUV mask 640 comprises a patterned reflective layer 642 (e.g., chrome, nitride) and a transparent quartz crystal substrate 644. The semiconductor structure 610 may be similar to the structure 510 described with respect to FIG. 5 above.

In the wafer exposure process, the layer 630 of material are irradiated 645 (or exposed to light at a wavelength in the EUV range—about 5 angstroms to about 25 angstroms) through one or more openings 635 of the patterned EUV mask 640. At pre-determined intervals of time during this exposure process, at least a portion of the EUV mask 640 is measured by an EUV mask inspection system 650. The inspection system 650 measures (via a scatterometer—not shown) portions of the EUV mask 640 by directing light 660 at a front and/or top surface of the EUV mask 640 and then by collected the light reflected 670 therefrom.

Figure 7:
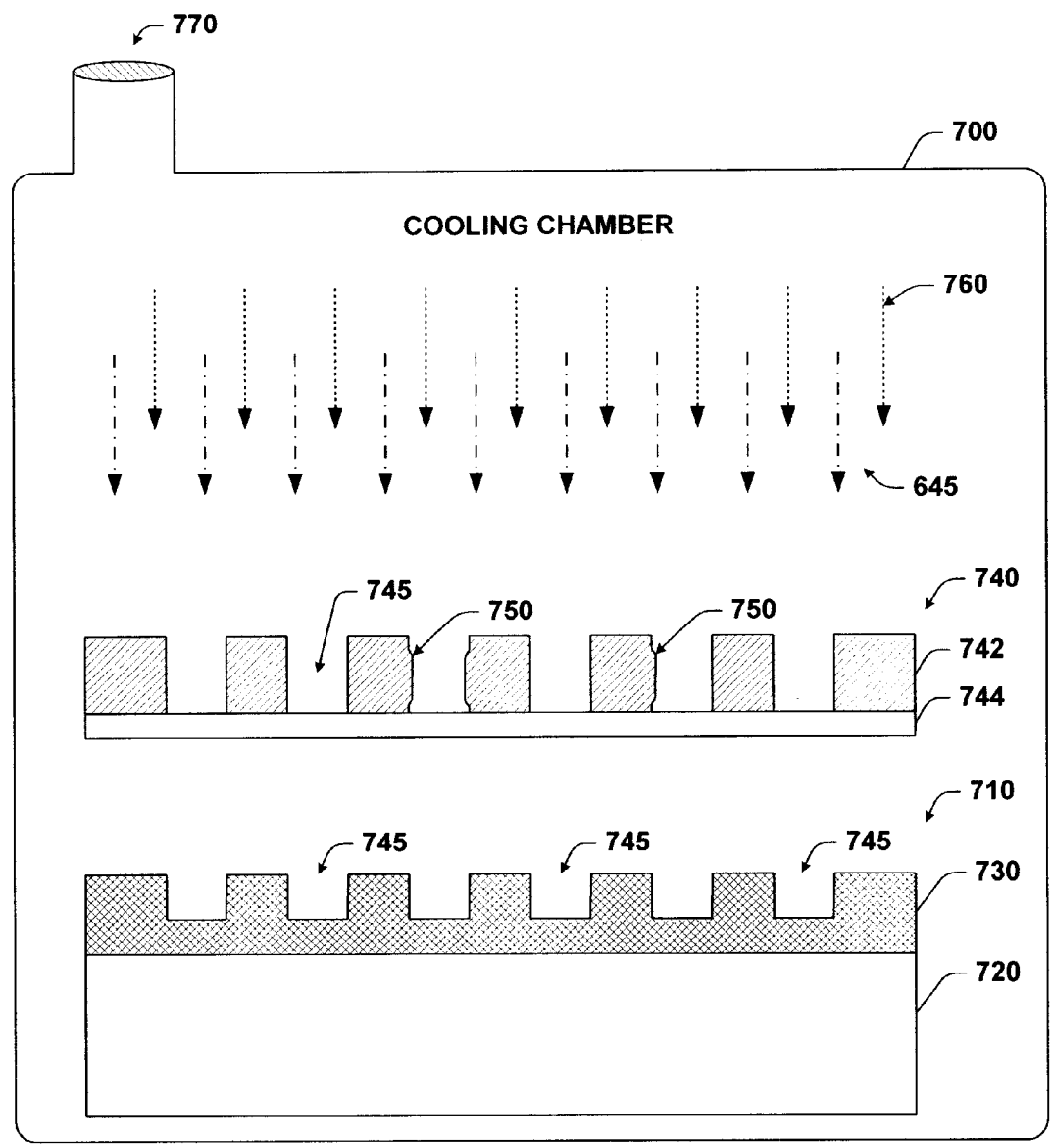
FIG. 7 illustrates a schematic, partially fabricated semiconductor structure having an EUV mask thereon which is being treated in order to mitigate thermal expansion occurring on the EUV mask in accordance with an aspect of the present invention.

In FIG. 7, a schematic illustration of a cooling chamber 700 is shown in accordance with an aspect of the present invention. A partially etched semiconductor structure 710 is shown as it may appear during a wafer exposure process. For example, exposed portions of a layer 730 of material overlying a substrate 720 are depicted as being partially removed to form partial features 745. The exposed portions of the layer 730 have been etched by an etch process 645 as described above in FIG. 6. In addition, an EUV mask 740 comprising a patterned chrome layer 742 over a transparent quartz crystal substrate 744 is positioned over the structure 710.

As can be seen in FIG. 7, portions 750 of the EUV mask 740 material are exhibiting indications of thermal expansion. In other words, due to the EUV mask materials, absorption tendencies of the material, and light used in the EUV wavelength range, heat has accumulated causing the temperature of the EUV mask to increase. The increased temperature of the EUV mask material results in the thermal expansion 750 of the mask 740. The inspection system (alone or in conjunction with an external processor) as previously described in FIGS. 1–6 determines the presence of thermal expansion in real time and communicates this information to a temperature control system (not shown). Evidence of thermal expansion may also appear in pitch measurements. For example, if the pitch on the EUV mask pattern should be 400 nm but during photolithography, the pitch on the mask is measured to be 402 nm, then it may be concluded that thermal expansion has occurred on the mask.

In order to control the amount of thermal expansion on the mask, the temperature control system signals a cooling system or chamber 700 to treat the EUV mask. A cooling treatment of the EUV mask is indicated by the dotted arrows 760 may be administered either at the affected portions of the mask or over the mask in its entirety.

The substance of the treatment may be supplied to the chamber at inlet 770 and may be made of any material and form of material suitable to decrease the temperature of the EUV mask and/or remove excessive heat from the mask-semiconductor structure in order to carry out the present invention without substantially interfering with or adversely affecting the EUV mask pattern, semiconductor structure, and photolithography process.

During treatment of the EUV mask, the etch or exposure process 645 may cease temporarily. Alternatively, the EUV mask 740 may be treated in between exposure processes such that the mask is cured before a subsequent exposure of the structure 710 occurs. In addition, the temperature control system may communicate adjustments to photolithography components in order to mitigate thermal expansion in future photolithography processes.

Figure 8:
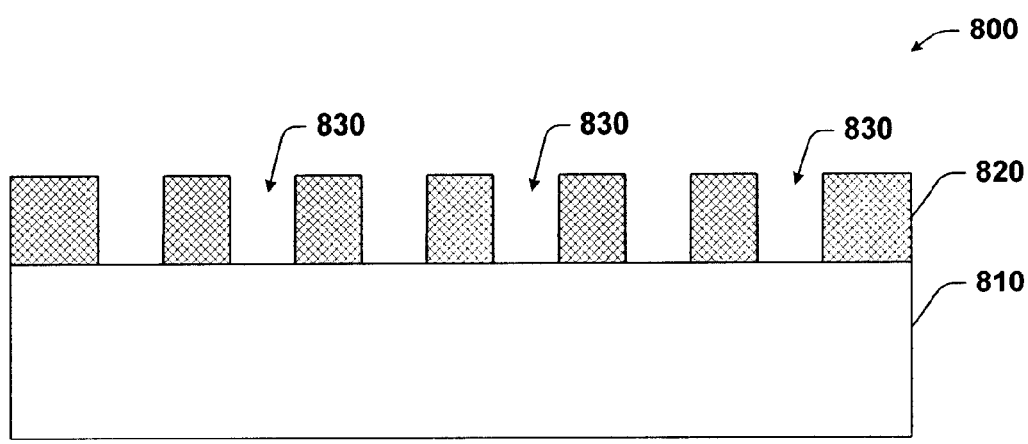
FIG. 8 illustrates a semiconductor structure which has been substantially formed in accordance with an aspect of the present invention.

FIG. 8 demonstrates a semiconductor structure 800 which has been substantially completed in accordance with an aspect of the present invention. The structure 800 comprises a silicon-based substrate 810 and a layer of material 820 which has been precisely and accurately etched and developed to yield features 830. Due to the real-time control of thermal expansion in the EUV mask 740, for example, the features 830 exhibit substantially no indications of malformation or distortion.

Figure 9:
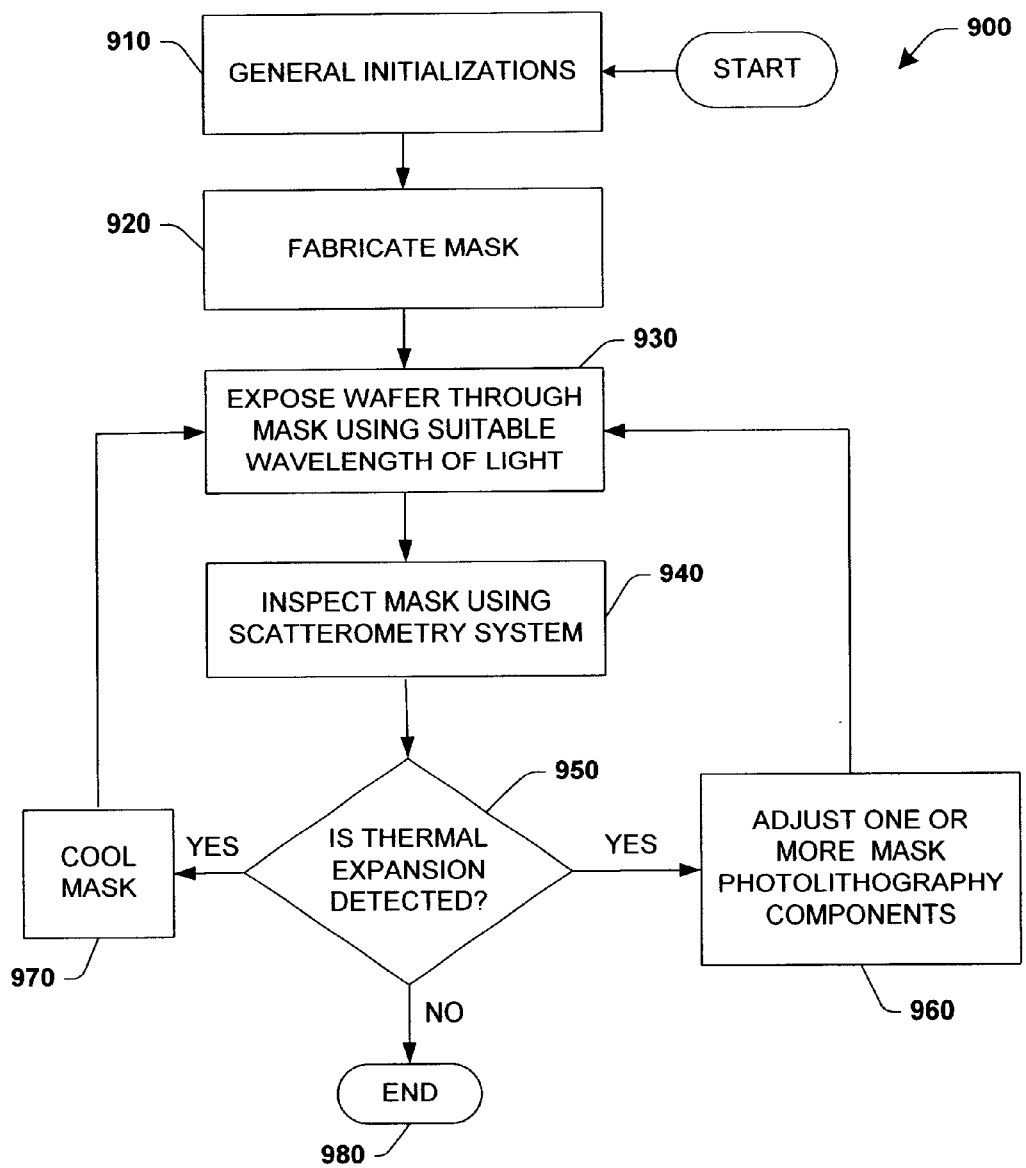
FIG. 9 illustrates a flow diagram of an exemplary method for controlling and/or mitigating thermal expansion of an EUV mask during an EUV photolithography process in accordance with an aspect of the present invention.

Referring now to FIG. 9, a schematic flow diagram of an exemplary method 900 for controlling thermal expansion on a mask during a photolithography process is shown. The method 900 may begin at 910 by making general initializations for the systems involved in order to carry out the present invention. At 920, a mask may be fabricated following the general initializations of the systems or prior to depending on the application and needs of the user.

At 930, a semiconductor structure or wafer comprising one or more layers formed over a substrate may be etched by exposing portions of the one or more layers to light through one or more openings in the mask. The wavelength of light employed may be selected by the user in order to effectively irradiate the wafer through the openings of the mask.

Before, during and after the semiconductor structure proceeds through the exposure or etch process, the mask may be inspected at 940 by utilizing a scatterometer to collect light data in order to determine measurements of at least a portion of the mask surface. Such measurements facilitate controlling and mitigating thermal expansion of the mask material.

If thermal expansion is detected at 950, data and/or information generated relating to the thermal expansion found with respect to the mask may be employed to make adjustments to one or more photolithography and/or exposure components in order to effectuate a change for future photolithography processes (at 960). That is, the process 900 facilitates optimizing future photolithography processes to be more efficient and more accurate in semiconductor device fabrication such that thermal expansion is controlled and/or mitigated to a desired amount.

Alternatively or in addition, the generated data may be used to trigger a signal to a cooling system. The cooling system is operative to treat the mask in order to mitigate and/or substantially eliminate thermal expansion (at 970). The treated mask may continue to be used in a subsequent exposure step of the current photolithography process.

However, if no thermal expansion is detected, then the method ends at 980 and fabrication of the semiconductor structure as well as the current photolithography process may continue as programmed. Alternatively, if an amount of thermal expansion is desired, then the method may be adapted to modify photolithography components or parameters in order to promote a desired amount of thermal expansion to occur on the current wafer and/or on subsequent wafers.

Although the invention has been shown and described with respect to several aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A system for controlling thermal expansion on a mask during photolithography of an underlying wafer comprising:
    a photolithography system comprising an irradiation source and a mask, whereby heat accumulates on at least a portion of the mask while irradiating one or more layers of the underlying wafer;
    a mask inspection system for monitoring one or more gratings on the mask to detect expansion therein, the mask inspection system producing data relating to the mask;
    a temperature control system operatively coupled to the mask inspection system and the photolithography system for making adjustments to the photolithography system in order to control the detected expansion on the mask and to mitigate undesirable pitch changes on the mask; and
    a mask cooling system operatively connected to the temperature control system such that the temperature control system signals the cooling system to treat the mask in order to compensate for the detected expansion on the mask.

2. The system of claim 1, wherein the data from the mask inspection system is fed forward to a subsequent photolithography process to facilitate forming features on a subsequent wafer using the mask such that thermal expansion on the mask is substantially mitigated.

3. The system of claim 1, wherein the data from the mask inspection system comprises numerical data and calculated values associated with an amount of thermal expansion at the one or more gratings of the mask.

4. The system of claim 1, wherein the mask inspection system comprises a scatterometer.

5. The system of claim 4, wherein the mask inspection system comprises a processor for computing measurements collected by the scatterometer.

6. The system of claim 1, wherein the temperature control system adjusts the photolithography system according to the data received from the mask inspection system.

7. The system of claim 1, wherein the mask inspection system communicates the data back to the photolithography system in order to control the detected expansion on the mask during a subsequent exposure of the wafer.

8. The system of claim 1, wherein the photolithography system comprises a wafer exposure system.

9. The system of claim 1, wherein the temperature control system signals the cooling system to treat the mask with cooling sufficient to control an undesired amount of the thermal expansion detected on the mask.

10. The system of claim 1, wherein the mask is anyone of a EUV mask, an I-line mask, a DUV mask and a G-line mask.

11. A system for controlling thermal expansion on a mask during photolithography of an underlying wafer comprising:
- a photolithography system comprising an irradiation source and a mask, whereby heat accumulates on at least a portion of the mask while irradiating one or more layers of a wafer;
- a mask inspection system for monitoring and measuring one or more gratings on the mask to detect expansion therein, the mask inspection system producing data relating to the mask;
- a processor operatively connected to the mask inspection system for processing and analyzing the data produced by the inspection system, thereby generating output related to the detected expansion on the mask;
- a mask temperature control system for receiving output generated by the processor in order to make an adjustment to one or more photolithography components to thereby compensate for the detected thermal expansion in the one or more of gratings on the mask; and
- a mask cooling system operatively connected to the mask temperature control system and the photolithography system for controlling and mitigating the accumulated heat on the mask such that the thermal expansion is controlled.

12. The system of claim 11, wherein the data from the mask inspection system is fed forward to a subsequent photolithography process to facilitate forming features on a subsequent wafer using the mask such that thermal expansion on the mask is substantially mitigated.

13. The system of claim 11, wherein the output from the processor comprises numerical data and calculated values relating to an amount of thermal expansion detected on the mask.

14. The system of claim 11, wherein the mask inspection system comprises a scatterometer for measuring one or more gratings on the mask to determine an occurrence of expansion at one or more gratings on the mask.

15. The system of claim 11, wherein the processor communicates the output back to the photolithography system in order to compensate for an undesired amount of the thermal expansion detected on the mask during a subsequent exposure of the wafer.

16. The system of claim 11, wherein the photolithography system comprises a wafer exposure system.

17. The system of claim 11, wherein the mask is anyone of a EUV mask, an I-line mask, a DUV mask and a G-line mask.

18. A method for controlling thermal expansion on a mask during a photolithography process comprising:
- providing a semiconductor structure having a mask thereover, the mask having one or more gratings therein;
- exposing the semiconductor structure through the one or more gratings of the mask with a wavelength of light during a wafer exposure process;
- monitoring the one or more gratings of the mask for thermal expansion in order to generate data related to the one or more gratings; and
- signaling a cooling chamber to treat the one or more gratings of the patterned mask where thermal expansion is detected in order to control an amount of thermal expansion on the mask.

19. The method of claim 18, wherein monitoring the one or more gratings of the patterned mask comprises:
- directing a beam of incident light at the one or more gratings on the mask;
- collecting light reflected from the one or more gratings on the mask; and
- analyzing the reflected light with respect to the incident light to determine whether the one or more gratings are affected by thermal expansion to facilitate controlling an amount of thermal expansion on the mask.

20. The method of claim 18, further comprising wherein monitoring the one or more gratings on the mask is performed by a scatterometer.

21. The method of claim 18, wherein etching of the semiconductor substrate is performed by a wafer exposure system via one or more photolithography components.

22. The method of claim 18, further comprising feeding data corresponding to the determined thermal expansion back to the etch process so as to effect a change in one or more photolithography components in order to mitigate the occurrence of thermal expansion in future photolithography processes.

23. The method of claim 18, further comprising feeding data corresponding to the thermal expansion forward to subsequent photolithography processes in order to mitigate thermal expansion during future processing.

24. The method of claim 18, further comprising feeding data corresponding to the thermal expansion back to the wafer exposure process in order to make an adjustment to one or more photolithography components so as to control an amount of thermal expansion on the mask for a subsequent exposure process.

25. The method of claim 18, further comprising cooling the mask during the photolithography process to control an amount of thermal expansion detected on the mask.

26. The method of claim 18, wherein the mask is anyone of a EUV mask, an I-line mask, a DUV mask and a G-line mask.

* * * * *